United States Patent
Devaney et al.

(10) Patent No.: US 8,281,738 B2
(45) Date of Patent: Oct. 9, 2012

(54) CATHODE AND COUNTER-CATHODE ARRANGEMENT IN AN ION SOURCE

(75) Inventors: Andrew Stephen Devaney, West Sussex (GB); Richard David Goldberg, Boston, MA (US); Christopher Burgess, East Essex (GB); David George Armour, Lancashire (GB); David Kirkwood, Cambridgeshire (GB)

(73) Assignee: Applied Materials, Inc., Santa Clara, CA (US)

( * ) Notice: Subject to any disclaimer, the term of this patent is extended or adjusted under 35 U.S.C. 154(b) by 1078 days.

(21) Appl. No.: 11/886,526

(22) PCT Filed: Mar. 22, 2006

(86) PCT No.: PCT/GB2006/001060
§ 371 (c)(1),
(2), (4) Date: Aug. 21, 2008

(87) PCT Pub. No.: WO2006/100487
PCT Pub. Date: Sep. 28, 2006

(65) Prior Publication Data
US 2009/0211896 A1    Aug. 27, 2009

(30) Foreign Application Priority Data
Mar. 22, 2005 (GB) .................................. 0505856.5

(51) Int. Cl.
*H01J 27/02* (2006.01)
(52) U.S. Cl. ......... 118/723 CB; 250/423 R; 315/111.81
(58) Field of Classification Search .............. 250/423 R, 250/427; 118/723 CB, 723 VE, 723 R; 315/111.21, 315/111.41, 111.31, 111.61, 111.71, 111.81, 315/111.91
See application file for complete search history.

(56) References Cited

U.S. PATENT DOCUMENTS

| 4,754,200 A | 6/1988 | Plumb et al. |
| 5,517,077 A | 5/1996 | Bright et al. |
| 5,703,372 A | 12/1997 | Horsky et al. |

(Continued)

FOREIGN PATENT DOCUMENTS

| CN | 1192575 | 9/1998 |
| JP | 7169425 | 7/1995 |
| TW | 471704 | 5/2000 |

OTHER PUBLICATIONS

S. Sampayan et al., "Enhanced Ionization Freeman Ion Source" in Nuclear Inst. & Methods in Phy. Res., B37/38 (1989), No. 2, pp. 90-93.

(Continued)

*Primary Examiner* — David Hung Vu
(74) *Attorney, Agent, or Firm* — Boult Wade Tennant

(57) ABSTRACT

The present invention relates to ion sources (14) comprising a cathode (20) and a counter-cathode (44) that are suitable for ion implanters (10). Typically, the ion source is held under vacuum and produces ions using a plasma generated within an arc chamber (16). Plasma ions are extracted from the arc chamber and subsequently implanted in a semiconductor wafer (12). The ion source according to the present invention further comprises a cathode (40) arranged to emit electrons into the arc chamber; an electrode (44) positioned in the arc chamber such that electrons emitted by the cathode are incident thereon; one or more voltage potential sources (76) arranged to bias the electrode; and a voltage potential adjuster (82) operable to switch between the voltage potential source biasing the electrode positively thereby to act as an anode and the voltage potential source biasing the electrode negatively thereby to act as a counter-cathode.

23 Claims, 5 Drawing Sheets

U.S. PATENT DOCUMENTS

| | | | |
|---|---|---|---|
| 5,977,552 | A | 11/1999 | Foad |
| 6,002,208 | A | 12/1999 | Malshev et al. |
| 6,777,686 | B2 | 8/2004 | Olson et al. |
| 7,138,768 | B2 | 11/2006 | Maciejowski et al. |
| 7,629,590 | B2 | 12/2009 | Horsky et al. |
| 7,732,787 | B2 * | 6/2010 | Horsky .................... 250/423 R |
| 7,800,312 | B2 | 9/2010 | Horsky |
| 2005/0051096 | A1 | 3/2005 | Horsky et al. |

OTHER PUBLICATIONS

P. Rose, "The Evolution of Ion Sources for Implaters (Invited)" in Review of Scientific Inst., 61 (1990), No. 1, Part II, pp. 342-347.

G. D. Alton, "Ion Sources for Accelerators in Materials Research" in Nuclear Inst. & Methods in Phy. Res., B73 (1993) No. 2, pp. 221-288.

English Abstract of JP 7169425, May 18, 2012.

* cited by examiner

CATHODE AND COUNTER-CATHODE ARRANGEMENT IN AN ION SOURCE

FIELD OF THE INVENTION

The present invention relates to ion sources comprising a cathode and a counter-cathode that are suitable for ion implanters.

BACKGROUND OF THE INVENTION

A contemplated application of the present invention is in an ion implanter that may be used in the manufacture of semiconductor devices or other materials, although many other applications are possible. In such an application, semiconductor wafers are modified by implanting atoms of desired dopant species into the body of the wafer to form regions of varying conductivity. Examples of common dopants are boron, phosphorus, arsenic and antimony.

Typically, an ion implanter contains an ion source held under vacuum within a vacuum chamber. The ion source produces ions using a plasma generated within an arc chamber. Plasma ions are extracted from the arc chamber and, in an "ion shower" mode, the ions travel to implant in a target such as a semiconductor wafer. Alternatively, the extracted ions may be passed through a mass analysis stage such that ions of a desired mass and energy are selected to travel onward to implant in a semiconductor wafer. A more detailed description of an ion implanter can be found in U.S. Pat. No. 4,754,200.

In a typical Bernas-type source, thermal electrons are emitted and accelerated under the influence of an electric field from a cathode and are constrained by a magnetic field to travel along spiral paths towards a counter-cathode. Interactions with precursor gas molecules within the arc chamber produces the desired plasma.

In one known arrangement, the counter-cathode is connected to the cathode such that they are at a common potential (U.S. Pat. Nos. 5,517,077 and 5,977,552). The counter-cathode is negatively-biased so that it repels electrons travelling from the cathode, increasing the number of spiral paths across the ion source thereby increasing ionisation efficiency in the arc chamber.

In another known arrangement, the counter-cathode is electrically isolated so that it floats to close to the potential of the plasma (U.S. Pat. No. 5,703,372).

The mass analysis stage of the implanter is operated by control of a magnetic field to allow selection of ions of a desired mass (via their momentum or mass to charge-state ratio) and rejection of unwanted ions (to the extent that they follow a different path in the magnetic field).

In the case of boron doping, for example, $BF_3$ is normally used as a precursor gas. Dissociation in the arc chamber results in a plasma typically containing $B^+$, $F^+$, $BF^+$ and $BF_2^+$ ions. This mixture of ions is extracted and enters the mass analysis stage which ensures that only the preferred $B/BF_x$ species is delivered to the semiconductor wafer. Although many implant recipes require $B^+$ ions to be implanted, others use $BF_2^+$ ions. Because the $BF_2^+$ ions dissociate on impact with a semiconductor wafer, the resulting boron atoms are implanted with reduced energy yielding shallower doping layers as is required in some applications.

SUMMARY OF THE INVENTION

An object of this invention is to increase the flexibility of operation of an ion source, for example to optimise the source for implanting different species derivable from a common source material or to optimise the output of a specific ion species from a particular feed material.

From a first aspect, the present invention resides in an ion source for an ion implanter, comprising:
an arc chamber arranged to generate and contain a plasma; a cathode arranged to emit electrons into the arc chamber; an electrode positioned in the arc chamber such that electrons emitted by the cathode are incident thereon; one or more voltage potential sources arranged to bias the electrode; and a voltage potential adjuster operable to switch between the voltage potential source biasing the electrode positively thereby to act as an anode and the voltage potential source biasing the electrode negatively thereby to act as a counter-cathode.

There does not appear to be a universally recognised term for a "counter-cathode". The terms "anti-cathode" and "reflector" appear also to be used synonymously within the art. The term "counter-cathode" will be used hereinafter to refer to this electrode and the term "counter-cathode" appearing in the claims should be construed accordingly. Essentially, it is an electrode that faces the cathode across the arc chamber and that previously was either tied to the potential of the cathode or was electrically isolated to allow it to float to close to the potential of the plasma.

With the arrangement provided by this invention, an arc can be struck between cathode and counter-cathode, the latter acting as an anode. Moreover, the positively-biased potential on the counter-cathode attracts electrons emitted by the cathode so that they travel to the counter-cathode where they are collected. Thus, electrons tend to traverse the arc chamber only once (assuming a conventional arrangement of opposed cathode and counter-cathode is used). The electrons have a shorter mean lifetime within the arc chamber when compared to the prior art arrangement having negatively-biased cathode and counter-cathode (a reflex mode of operation).

In the reflex mode of operation, the counter-cathode is held at the same potential as the cathode so that electrons are repeatedly reflected. This increases the lifetimes in the arc chamber of the electrons emitted by the cathode to produce a more intense plasma, enhancing ionisation and cracking of the source gas molecules. In the new, non-reflex mode of operation, the electrons are attracted to the positive counter-cathode where they are collected. As a result, the lifetime of electrons is decreased within the arc chamber.

However, it has been realised that the reduced electron lifetime results in reduced cracking of molecules. For example, if $BF_3$ is used as the precursor gas, fewer $B^+$ and $BF^+$ ions are produced. This means that although fewer ions may be produced in the plasma, a greater fraction of these remain as $BF_2^+$ ions. Surprisingly, it has been found that the reduced cracking provides enough of a gain in the production of larger ions such as $BF_2^+$ to more than compensate for any reduction in overall ion production. Experiments using $BF_3$ as a precursor gas indicate a gain as high as 70% in $BF_2^+$ ion beam current (this being a measurement of $BF_2^+$ ions that emerge from the mass analysis stage).

Hence, this new arrangement is advantageous where higher mass molecular ions such as $BF_2^+$ are to be used for implantation rather than the lower mass cracking products.

Moreover, it allows selection of the most appropriate mode of operation according to the required implant. Either of the modes may be selected depending upon the implant recipe, e.g. either to favour $B^+$ production or $BF_2^+$ production respectively.

Optionally, the ion source further comprises a vacuum chamber and the voltage potential adjuster is located in atmosphere. This allows switching between modes of operation without the need to vent the vacuum chamber to atmosphere in order to gain access to the voltage potential adjuster.

When operating in non-reflex mode, it is preferable to bias negatively the arc chamber walls to encourage electrons to travel to the counter-cathode. Alternatively, the arc chamber walls may be positively biased or they may be electrically isolated to be allowed to float to close to the potential of the plasma. In reflex mode, the chamber walls are positively biased to provide the anode to strike the required arc. As a result, the ion source may conveniently comprise a further voltage potential adjuster operable to bias an arc chamber wall positively or bias the arc chamber wall negatively. Again, to remove the need to vent the vacuum chamber, the further voltage potential adjuster may be located in atmosphere.

Preferably, the ion source is further arranged to operate with the voltage potential adjuster and further voltage potential adjuster set for at least first and second ion generation modes such that the counter-cathode is positively biased and the arc chamber wall is negatively biased, and vice versa, respectively. This corresponds to non-reflex and reflex modes respectively. It is advantageous, although optional, for the ion source to be further arranged to change between first and second ion generation modes and back by operating the voltage potential adjuster and the further voltage potential adjuster in turn so that the first switch is usually from a negative bias to a positive bias. This ensures there is always an anode available so that the arc continues to strike, thereby maintaining a plasma in the arc chamber. In this way, the arc chamber remains at an elevated, operating temperature.

Optionally, the voltage potential adjuster is arranged further to isolate electrically the counter-cathode and wherein the ion source is further arranged to operate with the voltage potential adjuster and further voltage potential adjuster set for a third ion generation mode such that the counter-cathode is electrically isolated and the arc chamber wall is positively biased.

This provides a third (floating) mode of operation where the potential of the counter-cathode is allowed to float to a potential set by the plasma. This provides an intermediate level of electron reflection by the counter-cathode and, hence, an intermediate level of cracking.

Optionally, the voltage potential adjuster may be a two-way switch arranged to switch between a first position that is arranged to bias the counter-cathode positively and a second position arranged to bias the counter-cathode negatively. Alternatively, the voltage potential adjuster may be a three-way switch arranged to switch between a first position that is arranged to bias the counter-cathode positively, a second position arranged to bias the counter-cathode negatively and a third position that is arranged to isolate electrically the counter-cathode.

Optionally, the further voltage potential adjuster is a switch arranged to switch between a first position arranged to bias the arc chamber wall positively and a second position arranged to bias the arc chamber wall negatively. The voltage adjusters or switches may optionally be configured to have the arc chamber wall and the counter-cathode at the same potential.

Optionally, the ion source further comprises a magnet assembly arranged to provide a magnetic field in the arc chamber that defines an electron path for electrons emitted by the cathode. This provides a longer electron path length for the thermal electrons that may otherwise be attracted directly to the adjacent arc chamber walls when operating in modes where the walls are at a positive potential relative to the cathode. The magnetic field constrains the electrons to pass along the length of the arc chamber where, for example, cathode and counter-cathode are located at opposed ends of the arc chamber.

From a second aspect, the present invention extends to an ion implanter including any of the ion sources described above. Optionally, the arc chamber further comprises an exit aperture and the ion implanter further comprises an extraction electrode operable to extract ions from the plasma contained within the arc chamber through the exit aperture, and so deliver extracted ions for implanting in a target. Optionally, the ion implanter may further comprise a mass analysis stage located to receive ions extracted from the arc chamber and operable to deliver ions of a selected mass and charge state, at a particular energy, for implanting into a target.

From a third aspect, the present invention resides in a method of operating an ion source, wherein the ion source comprises an arc chamber having a cathode and a counter-cathode, the method comprising: a first, reflex mode of operation comprising biasing the cathode negatively, biasing a chamber wall positively thereby striking a plasma between cathode and the chamber wall, and biasing the counter-cathode negatively thereby to repel electrons; and a second, non-reflex mode of operation comprising biasing the cathode negatively and biasing the counter-cathode positively thereby striking a plasma between the cathode and counter-cathode. Preferred features of this method are defined in the appended claims.

BRIEF DESCRIPTION OF THE DRAWINGS

An example of a method and apparatus in accordance with the present invention will now be described with reference to the accompanying drawings, in which.

DETAILED DESCRIPTION OF THE INVENTION

Figure 1:
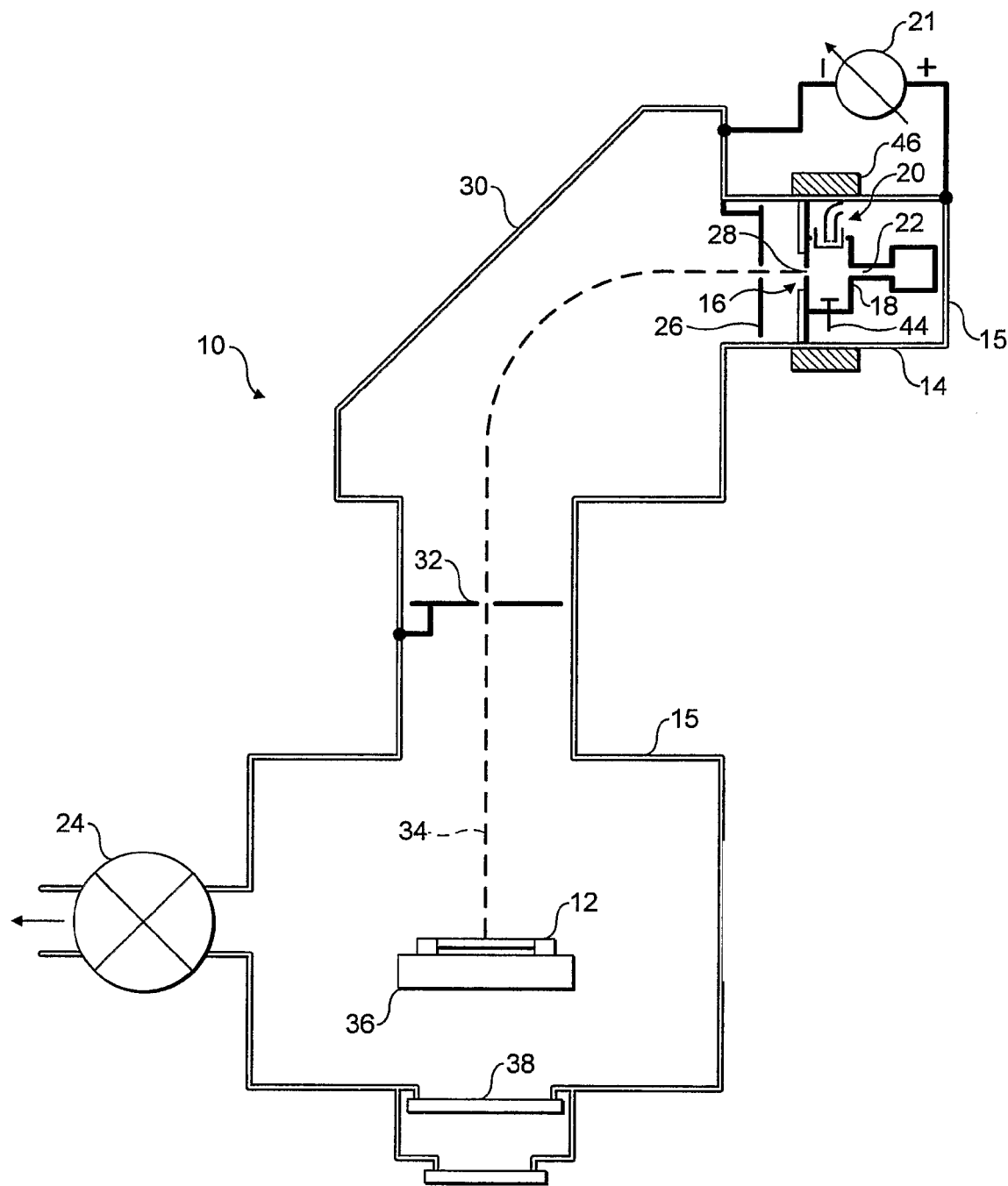
FIG. 1 is a schematic representation of an ion implanter.

In order to provide a context for the present invention, an exemplary application is shown in FIG. 1, although it will be appreciated that this is merely an example of an application of the present invention and is in no way limiting.

FIG. 1 shows a known ion implanter 10 for implanting ions in semiconductor wafers 12 including an ion source 14 according to the present invention. Ions are generated by the ion source 14 to be extracted and passed, in this embodiment, through a mass analysis stage 30. Ions of a desired mass are selected to pass through a mass-resolving slit 32 and then to strike a semiconductor wafer 12.

The ion implanter 10 contains an ion source 14 for generating an ion beam of a desired species that is located within a vacuum chamber 15. The ion source 14 generally comprises an arc chamber 16 containing a cathode 20 located at one end thereof. According to the prior art, the ion source 14 is operated such that an anode is provided by the walls 18 of the arc chamber 16. The cathode 20 is heated sufficiently to generate thermal electrons.

Thermal electrons emitted by the cathode 20 are attracted to the anode, the adjacent chamber walls 18 in this case. The thermal electrons ionise gas molecules as they traverse the arc chamber 16, thereby forming a plasma and generating the desired ions.

The path followed by the thermal electrons is controlled, according to the prior art, to prevent the electrons merely following the shortest path to the chamber walls 18. A magnet assembly 46 provides a magnetic field extending through the arc chamber 16 such that thermal electrons follow a spiral path along the length of the arc chamber 16 towards a counter-cathode 44 located at the opposite end of the arc chamber 16.

A gas feed 22 fills the arc chamber 16 with a precursor gas species, such as $BF_3$. The arc chamber 16 is held at a reduced pressure within the vacuum chamber 15. The thermal electrons travelling through the arc chamber 16 ionise the precursor $BF_3$ gas molecules and also crack the $BF_3$ molecules to form $BF_2$, BF and B molecules and ions. The ions created in the plasma will also contain trace amounts of contaminant ions (e.g. generated from the material of the chamber walls).

Ions from within the arc chamber 16 are extracted through an exit aperture 28 using a negatively-biased extraction electrode 26. A potential difference is applied between the ion source 14 and the following mass analysis stage 30 by a power supply 21 to accelerate extracted ions, the ion source 14 and mass analysis stage 30 being electrically isolated from each other by an insulator (not shown). The mixture of extracted ions are then passed through the mass analysis stage 30 so that they pass around a curved path under the influence of a magnetic field. The radius of curvature traveled by any ion is determined by its mass, charge state and energy and the magnetic field is controlled so that, for a set beam energy, only those ions with a desired mass to charge ratio and energy exit along a path coincident with the mass-resolving slit 32. The emergent ion beam is then transported to the target, i.e. the substrate wafer 12 to be implanted or a beam stop 38 when there is no wafer 12 in the target position. In other modes, the beam may also be accelerated or decelerated using a lens assembly positioned between the mass analysis stage 30 and the target position.

The semiconductor wafer 12 will be mounted on a wafer holder 36, wafers 12 being successively transferred to and from the wafer holder 36 for serial implantation. Alternatively, parallel processing may be used where many wafers 12 are positioned on a carousel 36 that rotates to present the wafers 12 to the incident ion beam in turn.

Figure 2:
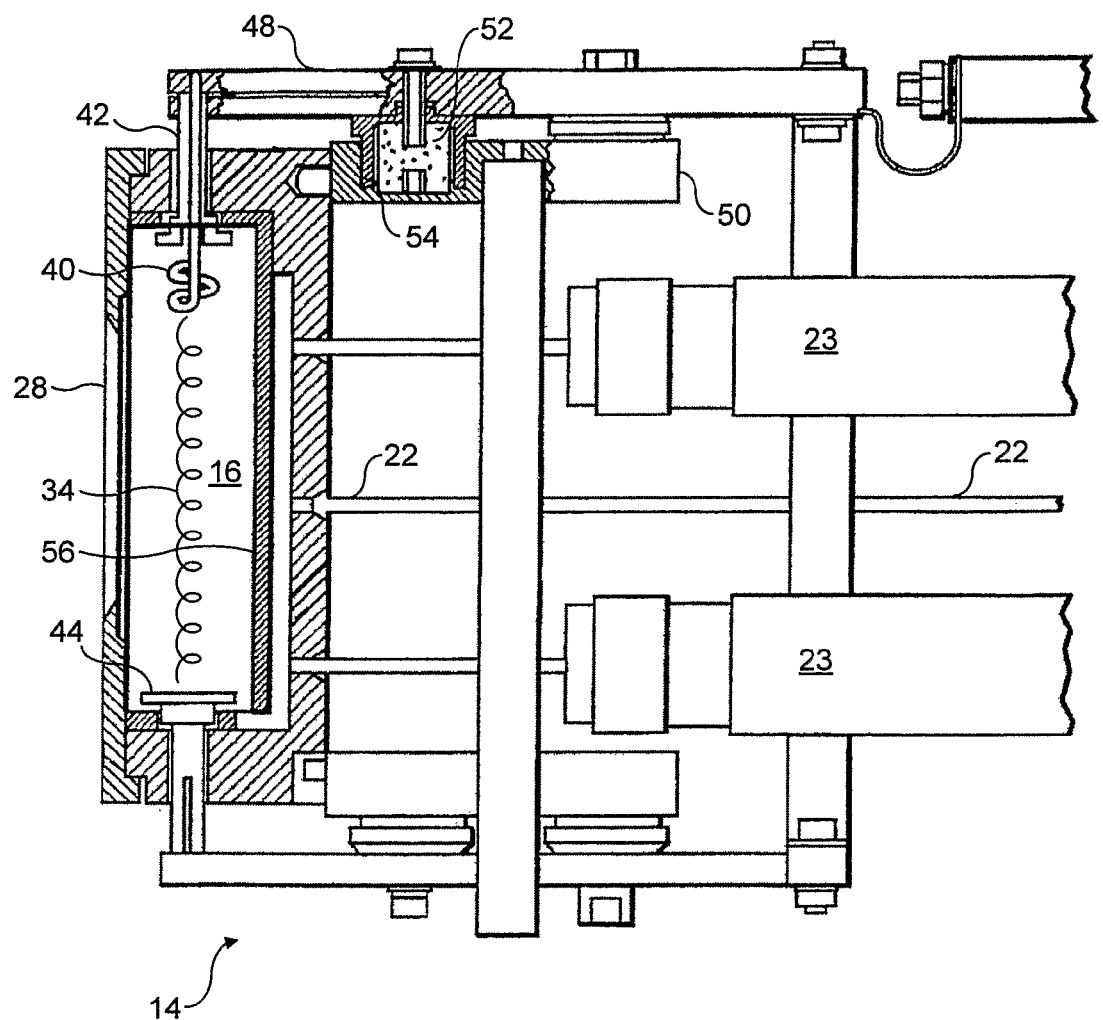
FIG. 2 is a side view of a first ion source.
Figure 3:
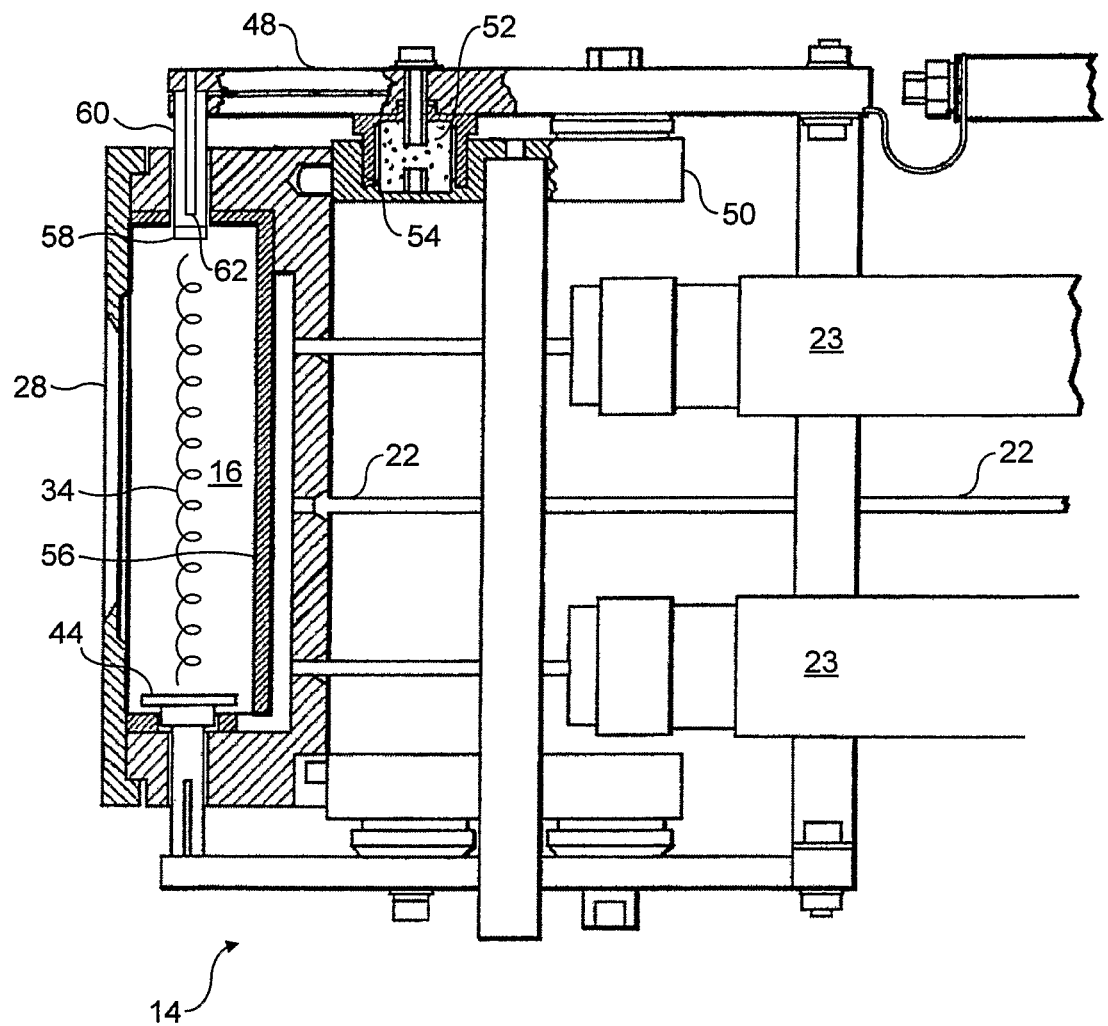
FIG. 3 is a side view of a second ion source that comprises an indirectly-heated cathode arrangement.

FIGS. 2 and 3 show in greater detail two known ion sources 14 that may be used in the ion implanter 10 of FIG. 1: FIG. 2 corresponds to a filament arrangement and FIG. 3 corresponds to an indirectly-heated cathode arrangement.

Referring first to FIG. 2, a filament 40 that acts as a cathode is situated at one end of the arc chamber 16 to sit in front of an electron reflector 42. The electron reflector 42 is held at the same negative potential as the filament 40 such that they are both negatively biased and repel electrons. There is a small gap between the electron reflector 42 and a liner 56 that comprises the innermost part of the arc chamber 16. This gap ensures that the electron reflector 42 is electrically isolated from the liner 56 that traditionally acts as an anode. The clearance is minimal to avoid loss of the pre-cursor gas from the arc chamber 16. A counter-cathode 44 is located at the far end of the arc chamber 16, again with a small separation from the liner 56 to ensure electrical isolation and to minimise gas leakage. A magnet assembly 46 (shown only in FIG. 1) is operable to provide a magnetic field that causes electrons emitted from the filament 40 to follow a spiral path 34 along the length of the arc chamber 16 towards the counter-cathode 44. The arc chamber 16 is filled with the precursor gas species by a gas feed 22 or by one or more vaporisers 23 that may heat a solid or liquid.

The filament 40 is held in place by two clamps 48 that are each connected to the body 50 of the ion source 14 using an insulating block 52. The insulating block 52 is fitted with a shield 54 to prevent any gas molecules escaping from the arc chamber 16 from reaching the insulator block.

As will be evident, FIG. 3 corresponds largely to FIG. 2 and so like parts will not be described again for the sake of brevity. In addition, like reference numerals are used for like parts.

The difference between FIG. 2 and FIG. 3 lies in the top of the arc chamber 16 where FIG. 3 shows an indirectly-heated cathode arrangement. A cathode is provided by an end cap 58 of a tube 60 that projects slightly into the arc chamber 16, the tube 60 containing a heating filament 62. The heating filament 62 and end cap 58 are kept at different potentials to ensure thermal electrons emitted by the filament 62 are accelerated into the end cap 58, and a gap is left between the tube 60 and the liner 56 of the arc chamber 16 to maintain electrical isolation. Acceleration of electrons into the end cap 58 transfers energy to the end cap 58 such that it heats up sufficiently to emit thermal electrons into the arc chamber 16.

This arrangement is an improvement over the filament arrangement of FIG. 3 because the filament 40 is eroded more quickly by the plasma's reactive ions and through ion bombardment. In order to alleviate this problem, the heating filament 62 of the indirectly-heated cathode is housed within the enclosed tube 60 such that ions do not come into contact with the heating filament 62.

Ion sources 14 with new biasing arrangements will now be described with reference to FIGS. 4 to 7.

Figure 4:
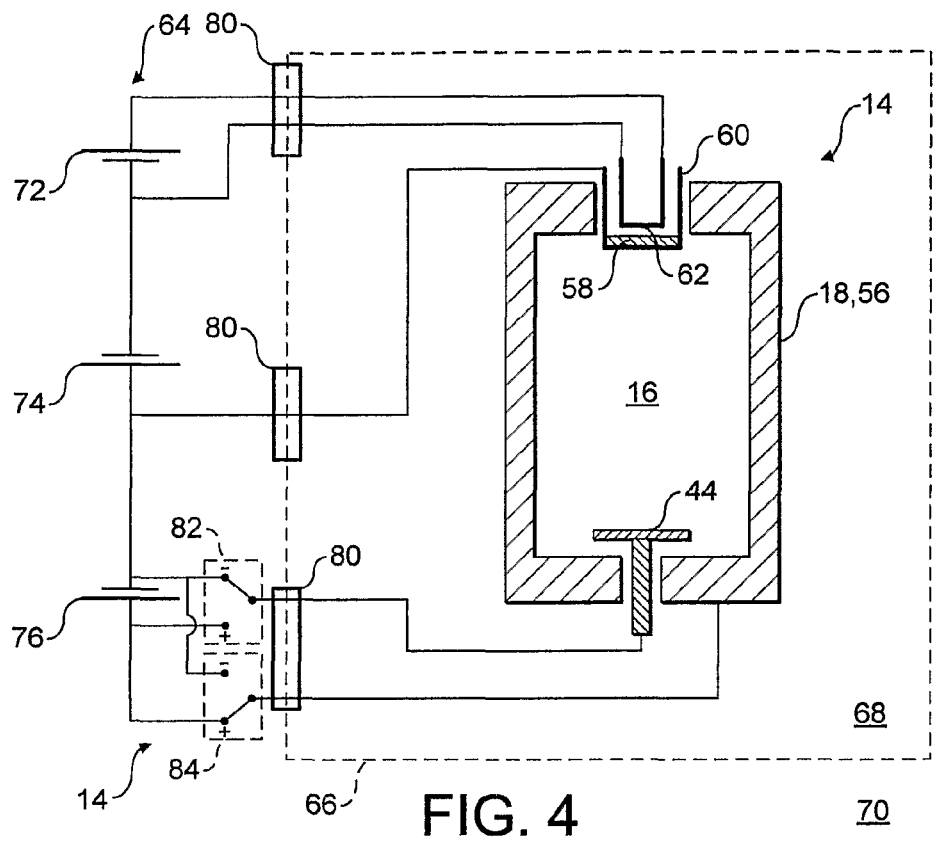
FIG. 4 is a simplified representation of an ion source with an indirectly-heated cathode arrangement, showing a biasing arrangement according to a first embodiment of the present invention.

Turning first to FIG. 4, a simplified representation of the arc chamber 16 of FIG. 3 alongside an electrical power supply 64 is shown. The dashed box 66 indicates the boundary between components that are housed within the vacuum chamber 15 and those components that are situated in atmosphere 70. Clearly, components located in atmosphere 70 can be readily adjusted without the need to break vacuum 68.

As can be seen from FIG. 4, a series of three power supplies located in atmosphere 70 provide electrical current to various components of the ion source 14 at different potentials. The ion source 14 includes an indirectly heated cathode. A filament supply 72 provides a relatively high current to the filament 62 of the indirectly-heated cathode. A bias supply 74 is used to bias the end cap 58 positively with respect to the filament 62 such that thermal electrons emitted from the filament 62 are accelerated towards the end cap 58. An arc supply 76 is used to create an anode by setting a large positive potential with respect to the end cap 58 that strikes the plasma and then maintains the plasma.

According to the prior art, ion source 14 should be operated in a reflex mode with the chamber walls 18 positively biased to provide an anode, and with the counter-cathode 44 negatively biased thereby to repel electrons.

The present invention provides a new, non-reflex mode of operation where a counter-cathode 44 is biased positively so that it acts as the anode, and the chamber walls 18 are negatively biased so that they repel electrons. These potentials act to guide electrons emitted from the end cap 58 to travel to the counter-cathode 44 where they complete the electrical circuit.

Alternatively, the chamber walls 18 may be positively biased, or the chamber walls 18 may be electrically isolated so that they float to a potential set by the plasma.

The ion source of FIG. 4 may be operated in either reflex (as shown in FIG. 4) or non-reflex mode of operation (not shown in FIG. 4, but merely corresponds to switches 82 and 84 being switched oppositely). This flexibility is enabled by a pair of switches 82 and 84 that allow either a positive or negative bias to be applied to the counter-cathode 44 and the chamber walls 18.

Electrical connections extend from the counter-cathode 44 and the chamber walls 18 to provide an electrical connection to switches 82 and 84 respectively. Switches 82 and 84 are located in atmosphere 70, so the electrical connections extend through a vacuum feed-through 80 at the vacuum/atmosphere interface 66. Placing the switches 82 and 84 in atmosphere 70 allows switching between modes of operation without the need to vent the vacuum chamber 15 to atmosphere. Either separate feed-throughs 80 or a common feed-through 80 may be used. The electrical connections from the filament supply 72 and bias supply 74 also pass through vacuum feed-throughs 80. Separate feed-throughs 80 may be used, although it is preferred to use a single feed-through 80 to route all these electrical connections. Alternatively, the switches 82, 84 may be located within the vacuum chamber 15.

Switch 82 is a two-way switch that connects the counter-cathode 44 to either of a pair of terminals. These terminals are connected electrically to either side of the arc supply 76, thereby providing positive and negative biasing to the counter-cathode 44. A similar arrangement is used for switch 84, i.e. switch 84 biases the chamber walls 18 positive or negative potentials taken from either side or the arc supply 76.

FIG. 4 shows the ion source 14 operating in reflex mode. Thus, switch 82 is set to its negative terminal so that the counter-cathode 44 is negatively biased. Switch 84 is set to its positive terminal so that the chamber walls 18 are positively biased.

For operation in the new non-reflex mode, the positions of switches 82 and 84 shown in FIG. 4 are merely reversed so that the counter-cathode 44 becomes positively biased and the chamber walls 18 become negatively biased. When operating in this mode, it is preferred either to switch magnet 46 off, or to operate the magnet 46 with a low current.

Operation between the two modes can be switched without having to extinguish the plasma, as follows. Starting from the reflex mode of operation illustrated in FIG. 4, switch 82 is first switched to bias the counter-cathode 44 positive, and subsequently switch 84 is switched to bias the chamber walls 18 negative. This ensures that the plasma is maintained as there is always a sufficient potential difference between a cathode and an anode. To change from the non-reflex mode of operation to the reflex mode, switch 84 is first switched to bias the chamber walls 18 positive, and subsequently switch 82 is switched to bias the counter-cathode 44 negative. Again, this ensures the plasma is maintained.

Figure 5:
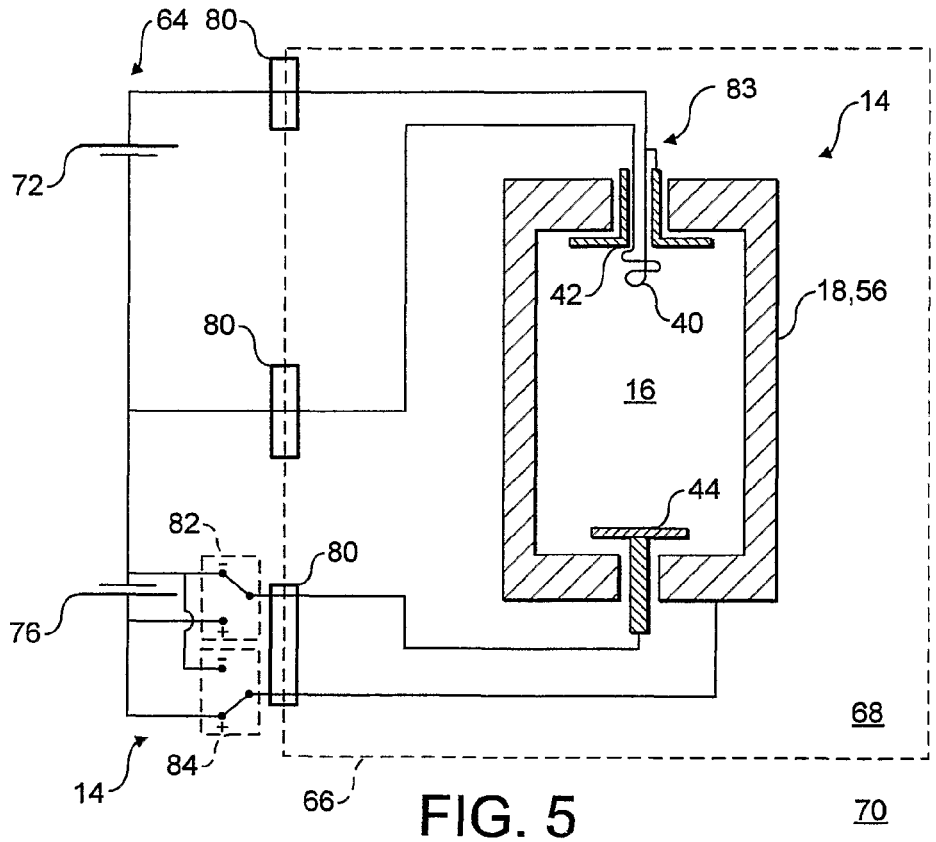
FIG. 5 is a simplified representation of an ion source with a simple filament arrangement showing a biasing arrangement according to a second embodiment of the present invention.

FIG. 5 corresponds broadly to FIG. 4 and so like parts will not be described again for the sake of brevity. In addition, like parts are assigned like reference numerals.

FIG. 5 shows an arrangement akin to FIG. 4 but having a filament 40 rather than an indirectly-heated cathode. The ion source 14 of FIG. 5 comprises a filament 40 located in front of an electron reflector 42. The filament 40 and electron reflector 42 are held at a common negative potential at all times via an electrical connection 83 that can be made within vacuum 68. In addition, there is no need for a separate bias supply 74 as there is no potential difference between filament 40 and electron reflector 42. Accordingly, a single arc supply 76 sets the potentials of the electron reflector 42 and the filament 40 with respect to the walls 18 (or liner 56).

Otherwise, the embodiment of FIG. 5 corresponds to the embodiment of FIG. 4. Accordingly, the potentials of the counter-cathode 44 and the chamber walls 18 may be switched as before to allow both modes of operation.

Figure 6:
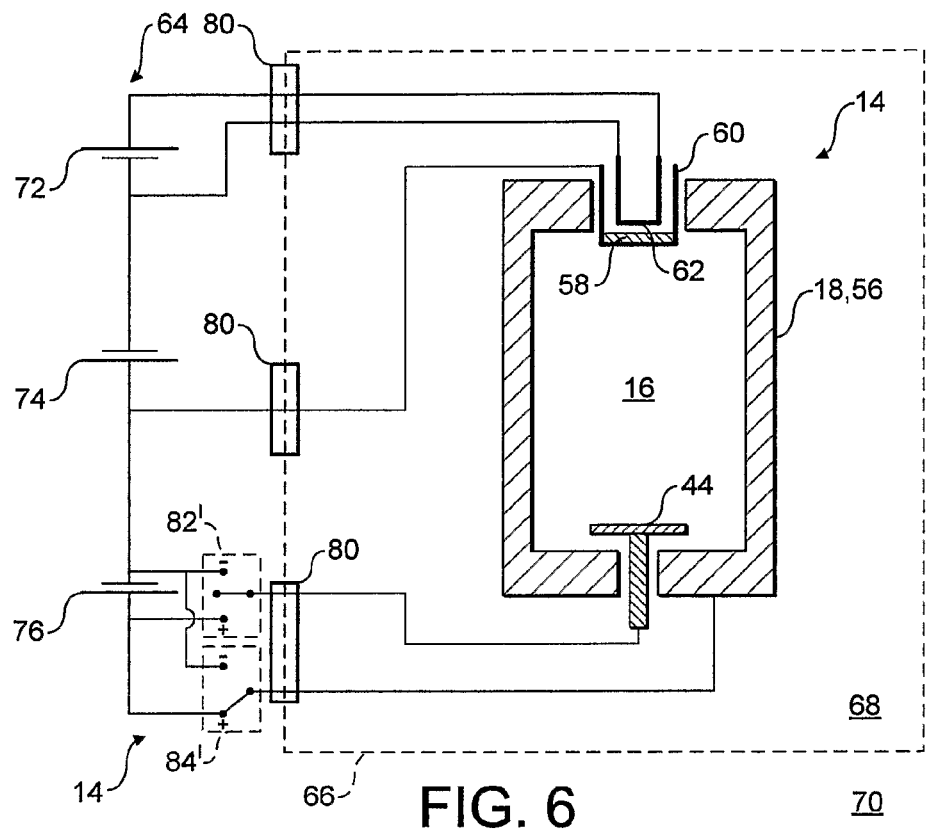
FIG. 6 corresponds to FIG. 4, but shows a third embodiment of the present invention comprising a three-way switch for setting the potential of the counter-cathode.

FIG. 6 corresponds broadly to FIG. 4 and so like parts will not be described again. Like parts are also assigned like reference numerals. FIG. 6 differs from FIG. 4 in that the two-way switch 82 has been replaced by a three-way switch 82'. Switch 82' has the same positive and negative terminals to allow the counter-cathode 44 to be biased both positively and negatively. However, a third terminal is provided that merely serves to isolate electrically the counter-cathode 44. This floating mode of operation is only for use when the chamber walls 18 are positive. The ion source 14 is configured for the floating mode of operation. This floating mode of operation provides an intermediate electron lifetime where electrons are no longer reflected as strongly by the counter-cathode 44 as when the counter-cathode 44 is held negative, but are reflected more relative to when the counter-cathode 44 is held positive.

When the potential of the counter-cathode 44 is held negative, the probability of cracking $BF_3$ molecules in the arc chamber 16 is increased due to the higher electron density in the arc chamber 16. Accordingly, the percentage of boron ions in the plasma relative to the total of other ion types increases (e.g. BF and $BF_2$ ions). When the counter-cathode 44 is isolated and allowed to float to a potential set by the plasma, cracking is reduced such that more molecular ions (e.g. $BF^+$ and/or $BF_2^+$) remain in the plasma. When the counter-cathode 44 is biased positively, cracking is even further reduced. As described previously, either boron or $BF_2^+$ ions may be preferred for ion implantation of semiconductor wafers 12. Switching the potential of the counter-cathode 44 maximises the number of preferred ions incident on the mass analysis stage 30 and hence available for onward transmission to the semiconductor wafer 12. Therefore, the counter-cathode 44 may be biased to create preferentially a particular dopant.

Figure 7:
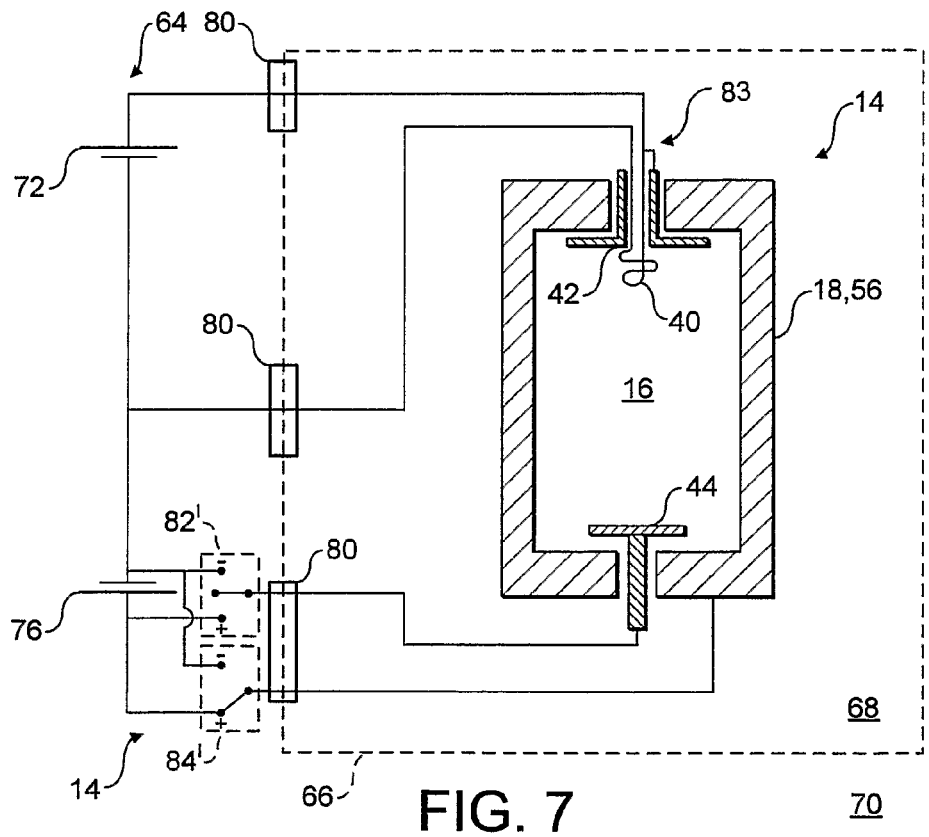
FIG. 7 corresponds to FIG. 5, but shows a fourth embodiment of the present invention comprising a three-way switch for setting the potential of the counter-cathode.

FIG. 7 shows the same three-way switch 82 (and consequent three modes of operation) applied to the ion source of FIG. 5. When the switch 82 is set to the third terminal, as shown, the counter-cathode 44 is free to float to the potential of the plasma within the arc chamber 16.

The skilled person will appreciate that variations can be made to the above embodiments without departing from the scope of the present invention.

It has been noted above that the chamber walls 18 may be operated to be at a positive bias, a negative bias or electrically isolated. FIGS. 4 to 7 show a two-way switch 84, 84' that allows the bias to be changed from positive to negative, and back. Replacing this switch 84, 84' with a three-way switch, akin to switch 82' of FIGS. 6 and 7, would allow three-way switching between positive bias, negative bias and electrical isolation.

Whilst the above embodiments use switches 82 and 84 to allow the potential of the counter-cathode 44 and chamber walls 18 to be varied by connecting to either side of the arc supply 76, other arrangements are possible. For example, a switch may be used to connect the counter-cathode 44 and/or the chamber walls 18 to one or more alternative power supplies. Alternative power supplies may be one of those show in FIGS. 4 to 7 or they may be further power supplies. The switching arrangements illustrated above are preferred for their simplicity. A further alternative would be a potential divider connected to provide a divided voltage potential and a switch operable to connect the counter-cathode 44 to one of the cathode 20 or the divided voltage potential. Still further, a variable power supply or a variable resistance or variable potentiometer may be used to supply a selected voltage to the counter cathode 44 and/or the chamber walls 18.

The switches 82 and 84 can be implemented in any number of standard ways. Switches are merely an example, and many other arrangements are possible.

Clearly the materials used in the construction of the ion source 14 and the particular arrangement of components can be chosen as required.

Whilst the above embodiments present the invention in the context of an ion source 14 of an ion implanter 10, the present invention can be used in many other applications such as an ion shower system, in which ions that are extracted from the ion source 14 are implanted into a target without undergoing mass analysis, or any other ion source 14 utilising a counter-cathode 44 in which selective ionization and/or molecular cracking is desirable.

The invention claimed is:

1. An ion source for an ion implanter, comprising: an arc chamber arranged to generate and contain a plasma; a cathode arranged to emit electrons into the arc chamber; an electrode positioned in the arc chamber such that electrons emitted by the cathode are directed thereat; one or more voltage potential sources arranged to bias the electrode; a voltage potential adjuster operable to switch between the voltage potential source biasing the electrode positively thereby to act as an anode and the voltage potential source biasing the electrode negatively thereby to act as a counter-cathode and a further voltage potential adjuster arranged to switch between biasing an arc chamber wall positively and biasing the arc chamber wall negatively.

2. The ion source of claim 1, further comprising a vacuum chamber and wherein the voltage potential adjuster is located in atmosphere.

3. The ion source of claim 1, comprising a vacuum chamber and wherein the further voltage potential adjuster is located in atmosphere.

4. The ion source of claim 1, further arranged to operate with the voltage potential adjuster and further voltage potential adjuster set for at least first and second ion generation modes such that the electrode is positively biased and the arc chamber wall is negatively biased, and vice versa, respectively.

5. The ion source of claim 4, further arranged to change between first and second ion generation modes and back by operating the voltage potential adjuster and the further voltage potential adjuster in turn so that the first switch is from a negative bias to a positive bias.

6. The ion source of claim 1, wherein the voltage potential adjuster is arranged further to isolate electrically the electrode.

7. The ion source of claim 1, wherein the further voltage potential adjuster is arranged further to isolate electrically the arc chamber wall.

8. The ion source of claim 4, wherein the voltage potential adjuster is arranged further to isolate electrically the electrode and wherein the ion source is further arranged to operate with the voltage potential adjuster and further voltage potential adjuster set for a third ion generation mode such that the electrode is electrically isolated and the arc chamber wall is positive.

9. The ion source of claim 1, wherein the voltage potential adjuster is a switch arranged to switch between a first position that biases the electrode positively and a second position that biases the electrode negatively.

10. The ion source of claim 6, wherein the voltage potential adjuster is a switch arranged to switch between a first position that is arranged to bias the electrode positively, a second position arranged to bias the electrode negatively and a third position arranged to isolate electrically the electrode.

11. The ion source of claim 1, wherein the further voltage potential adjuster is a further switch arranged to switch between a first position arranged to provide a positive potential with respect to the cathode to the arc chamber wall and a second position arranged to provide a negative potential with respect to the electrode to the arc chamber wall.

12. The ion source of claim 7, wherein the further voltage potential adjuster is a further switch arranged to switch between a first position that is arranged to bias the arc chamber wall positively, a second position arranged to bias the arc chamber wall negatively and a third position arranged to isolate electrically the arc chamber wall.

13. The ion source according to claim 1, wherein the cathode is a filament or an end cap of a tube of an indirectly-heated cathode type of ion source.

14. The ion source according to claim 13, further comprising an electrode operable as an electron reflector located adjacent the filament of an ion source.

15. The ion source according to claim 1, further comprising a magnet assembly arranged to provide a magnetic field in the arc chamber that defines an electron path for electrons emitted by the cathode.

16. An ion implanter including the ion source of claim 1.

17. The ion implanter according to claim 16, wherein the arc chamber further comprises an exit aperture and the ion implanter further comprises an extraction electrode operable to extract ions from the plasma contained within the arc chamber through the exit aperture and so deliver extracted ions for implanting in a target.

18. The ion implanter according to claim 17, further comprising a mass analysis stage located to receive ions extracted from the arc chamber and operable to deliver ions of a selected mass and charge state, at a particular energy, for implanting into a target.

19. A method of operating the ion source as defined in claim 1, comprising: a first, reflex mode of operation comprising biasing the cathode negatively, biasing a chamber wall positively thereby striking a plasma between cathode and the chamber wall, and biasing the counter-cathode negatively thereby to repel electrons; and a second, non-reflex mode of operation comprising biasing the cathode negatively and biasing the counter-cathode positively thereby striking a plasma between the cathode and counter-cathode.

20. The method of claim 19, further comprising electrically isolating an arc chamber wall in the non-reflex mode of operation.

21. The method of claim 19, further comprising switching from the non-reflex mode to the reflex mode by switching the bias on the arc chamber wall from negative to positive and then switching the bias on the counter-cathode from positive to negative.

22. The method of claim 21, further comprising disconnecting the counter-cathode so that it is electrically isolated.

23. The method of claim 19, further comprising switching to a third mode of operation by ensuring the bias on the arc chamber wall is positive and disconnecting the counter-cathode so that it is electrically isolated.

* * * * *